(12) United States Patent
Wang et al.

(10) Patent No.: US 12,244,998 B2
(45) Date of Patent: Mar. 4, 2025

(54) IMPEDANCE APPARATUS AND SYSTEMS FOR SIMULATING AN EFFECT OF THE HEAD ON VIBRATION OF A VIBRATION UNIT

(71) Applicant: SHENZHEN SHOKZ CO., LTD., Guangdong (CN)

(72) Inventors: Zhen Wang, Shenzhen (CN); Junjiang Fu, Shenzhen (CN); Lei Zhang, Shenzhen (CN)

(73) Assignee: SHENZHEN SHOKZ CO., LTD., Shenzhen (CN)

( * ) Notice: Subject to any disclaimer, the term of this patent is extended or adjusted under 35 U.S.C. 154(b) by 389 days.

(21) Appl. No.: 17/812,720

(22) Filed: Jul. 14, 2022

(65) Prior Publication Data
US 2022/0360885 A1 Nov. 10, 2022

Related U.S. Application Data

(63) Continuation of application No. PCT/CN2021/141078, filed on Dec. 24, 2021.

(30) Foreign Application Priority Data

Jan. 11, 2021 (CN) .......................... 202110033059.0

(51) Int. Cl.
*H04R 1/28* (2006.01)
*G08B 6/00* (2006.01)
(Continued)

(52) U.S. Cl.
CPC .............. *H04R 1/288* (2013.01); *G08B 6/00* (2013.01); *H03G 5/165* (2013.01);
(Continued)

(58) Field of Classification Search
CPC .............. H04R 2460/13; H04R 29/001; H04R 25/606; F16F 7/114; F16F 7/116
See application file for complete search history.

(56) References Cited

U.S. PATENT DOCUMENTS

| 5,624,377 A | 4/1997 | Davis |
| 5,771,298 A | 6/1998 | Davis et al. |

(Continued)

FOREIGN PATENT DOCUMENTS

| CN | 202996287 U | 6/2013 |
| CN | 103644243 A | 3/2014 |

(Continued)

OTHER PUBLICATIONS

Notice of Reasons for Rejection in Japanese Application No. 2022-554896 mailed on Oct. 16, 2023, 11 pages.
(Continued)

*Primary Examiner* — Kile O Blair
(74) *Attorney, Agent, or Firm* — METIS IP LLC

(57) ABSTRACT

The present disclosure provides an impedance apparatus. The apparatus includes a mass component, at least one elastic component, and a fixed component, the mass component connecting with the fixed component through the at least one elastic component; a damping component disposed between the mass component and the fixed component and providing damping for a movement of the mass component relative to the fixed component. When the mass component is in contact with an external vibration unit, the mass component receives a vibration of the external vibration unit and moves relative to the fixed component, a mass of the mass component is in a range of 0.5 g-5 g, an elastic coefficient of the at least one elastic component is in a range of 600 N/m-5000 N/m, a damping of the damping component is in a range of 1-4, and the impedance apparatus
(Continued)

provides the external vibration unit with a mechanical impedance in a range of 6 dB-50 dB.

20 Claims, 11 Drawing Sheets

(51) Int. Cl.
*H03G 5/16* (2006.01)
*H04R 1/10* (2006.01)

(52) U.S. Cl.
CPC ......... *H04R 1/1008* (2013.01); *H04R 1/1041* (2013.01); *H04R 1/105* (2013.01); *H04R 1/1091* (2013.01); *H04R 2460/13* (2013.01)

(56) References Cited

U.S. PATENT DOCUMENTS

| | | |
|---|---|---|
| 9,746,047 B2 | 8/2017 | Iwaki |
| 2002/0122560 A1 | 9/2002 | An |
| 2014/0283614 A1 | 9/2014 | Inagaki et al. |
| 2016/0123423 A1 | 5/2016 | Iwaki |
| 2016/0320233 A1 | 11/2016 | Inagaki |
| 2019/0028819 A1 | 1/2019 | Vermeiren et al. |
| 2021/0044904 A1 | 2/2021 | Ge |

FOREIGN PATENT DOCUMENTS

| | | | |
|---|---|---|---|
| CN | 105007551 A | 10/2015 | |
| CN | 107024537 A | 8/2017 | |
| CN | 207039903 U | 2/2018 | |
| CN | 208333665 U | 1/2019 | |
| DE | 102019000949 A1 | 8/2020 | |
| EP | 2785075 B1 * | 5/2016 | ............ H04R 25/30 |
| JP | 63167534 U | 11/1988 | |
| JP | H036821 A | 1/1991 | |
| JP | 2005036821 A | 2/2005 | |
| JP | 2012053434 A | 3/2012 | |
| JP | 2018186572 A | 11/2018 | |
| KR | 101390502 B1 | 4/2014 | |

OTHER PUBLICATIONS

International Search Report in PCT/CN2021/141078 mailed on Mar. 28, 2022, 6 pages.
Written Opinion in PCT/CN2021/141078 mailed on Mar. 28, 2022, 6 pages.
The Extended European Search Report in European Application No. 21917289.7 mailed on Jul. 14, 2023, 7 pages.
First Examination Report in Indian Application No. 202217042480 mailed on Nov. 12, 2024, 7 pages.

* cited by examiner

200

300

400

500

800

900

(a)

(b)

(c)

IMPEDANCE APPARATUS AND SYSTEMS FOR SIMULATING AN EFFECT OF THE HEAD ON VIBRATION OF A VIBRATION UNIT

CROSS-REFERENCE TO RELATED APPLICATION

This application is a continuation of International Patent Application No. PCT/CN2021/141078, filed on Dec. 24, 2021, which claims the priority of Chinese Patent Application No. 202110033059.0, filed on Jan. 11, 2021, the contents of each of which are entirely incorporated herein by reference.

TECHNICAL FIELD

The present disclosure relates to the field of vibration simulation, and more particularly to a system for simulating an effect of the head on vibration of a vibration unit.

BACKGROUND

A vibration unit may generate a vibration signal and transmit the vibration signal to a human head (e.g., head bones). In order to simulate an effect of the human head on the vibration of the vibration unit to understand vibration characteristics of the vibration unit, it is usually necessary to couple the vibration unit with an apparatus for simulating the human head. In some application scenarios, when the vibration unit is used as a bone conduction earphone or a bone conduction hearing aid, the vibration unit fits a facial region on the front side of the user's auricle, and a bone in this region of the human head is relatively soft relative to the skull, mastoid, etc. That is, the mechanical impedance of the facial region on the front side of the user's auricle is significantly different from the mechanical impedance of other parts of the human head. However, an existing apparatus for simulating the human head generally simulates the mechanical impedance of the mastoid behind the ear of the user, which obviously cannot meet the simulation scenario in which the vibration unit fits the facial region on the front side of the human auricle.

Therefore, it is necessary to provide an impedance apparatus for simulating a facial region on the front side of the human auricle, and a system for simulating an effect thereof on the vibration of the vibration unit.

SUMMARY

Some embodiments of the present disclosure provide an impedance apparatus, comprising: a mass component, at least one elastic component, and a fixed component. The mass component connects with the fixed component through the at least one elastic component. A damping component is disposed between the mass component and the fixed component and provides damping for a movement of the mass component relative to the fixed component. When the mass component is in contact with an external vibration unit, the mass component receives a vibration of the external vibration unit and moves relative to the fixed component. A mass of the mass component is in a range of 0.5 g-5 g, an elastic coefficient of the at least one elastic component is in a range of 600 N/m-5000 N/m, a damping of the damping component is in a range of 1-4, and the impedance apparatus provides the external vibration unit with a mechanical impedance in a range of 6 dB-50 dB.

In some embodiments, a mass of the mass component is in a range of 1 g-3.6 g, an elastic coefficient of the at least one elastic component is in a range of 900 N/m-1700 N/m, and a damping of the damping component is in a range of 2-3.7.

In some embodiments, a frequency response curve of the impedance apparatus has a valley, a valley value is in a range of 6 dB to 15 dB.

In some embodiments, when a frequency is less than a frequency corresponding to the valley value, a mechanical impedance of the impedance apparatus decreases as the frequency increases; when the frequency is greater than the frequency corresponding to the valley value, the mechanical impedance of the impedance apparatus increases as the frequency increases.

In some embodiments, the fixed component includes a fixed arm, the mass component is disposed opposite to the fixed arm, one side of the mass component faces the fixed arm, and the other side of the mass component faces away from the fixed arm.

In some embodiments, the damping component is located between the mass component and the fixed arm.

In some embodiments, the damping component includes at least one of a spring damper, a hydraulic damper, a friction damper, a pulse damper, a rotary damper, a viscous damper, an airflow damper, a damping hinge, or a damping slide rail.

In some embodiments, the at least one elastic component includes a spring, and the damping component is filled in or around the spring.

In some embodiments, the fixed component is a casing structure with one end open, and the mass component is suspended at an opening of the casing structure through the at least one elastic component.

In some embodiments, the at least one elastic component includes a first end part and a second end part, the first end part of the at least one elastic component is connected with a side wall of the mass component, and the second end part of the at least one elastic component is connected with an inner wall of the casing structure.

In some embodiments, the at least one elastic component may include multiple elastic components, and the multiple elastic components are distributed along the side wall of the mass component at intervals.

In some embodiments, the at least one elastic component includes at least one of a compression spring, an extension spring, a torsion spring, a coil spring, or a leaf spring.

In some embodiments, the at least one elastic component further includes a mesh structure.

In some embodiments, the damping component is located between the mass component and a bottom wall of the casing structure, wherein one end of the damping component is connected with a side of the mass component, and the other end of the damping component is connected with the bottom wall of the casing structure.

In some embodiments, a sealed cavity is formed between the mass component and the casing structure, and a gas in the sealed cavity forms the at least one elastic component.

Other embodiments of the present disclosure provide a system for simulating an effect of a head on vibration of a vibration unit. The system includes a vibration unit configured to provide a vibration signal; an impedance apparatus, the impedance apparatus contacting the vibration unit and providing a mechanical impedance to the vibration unit; a connector configured to couple the vibration unit with the impedance apparatus; and a sensor configured to collect parameter information of the vibration unit during a vibration process.

In some embodiments, the connector provides a pressure of 0.05 N-3.5 N between the vibration unit and the impedance apparatus.

In some embodiments, an area of a coupling region of the impedance apparatus and the vibration unit is in a range of 0.25 cm$^2$-4 cm$^2$.

In some embodiments, the connector includes a base, a support rod, and a fixing member, the support rod is connected with the base, the fixing member includes a first end part and a second end part, the first end part of the fixing member is connected with the support rod, and the second end part of the fixing member is connected with the vibration unit.

In some embodiments, the system further includes a head model, and the impedance apparatus is located in a vicinity of a tragus region of the head model.

In some embodiments, the connector is a ribbon-like structure, and the ribbon-like structure surrounds the head model and secures the vibration unit at the impedance apparatus.

In some embodiments, the connector is an ear-hook structure, the ear-hook structure is adapted to an auricle of the head model, and the ear-hook structure secures the vibration unit at the impedance apparatus.

DETAILED DESCRIPTION

Figure 1:
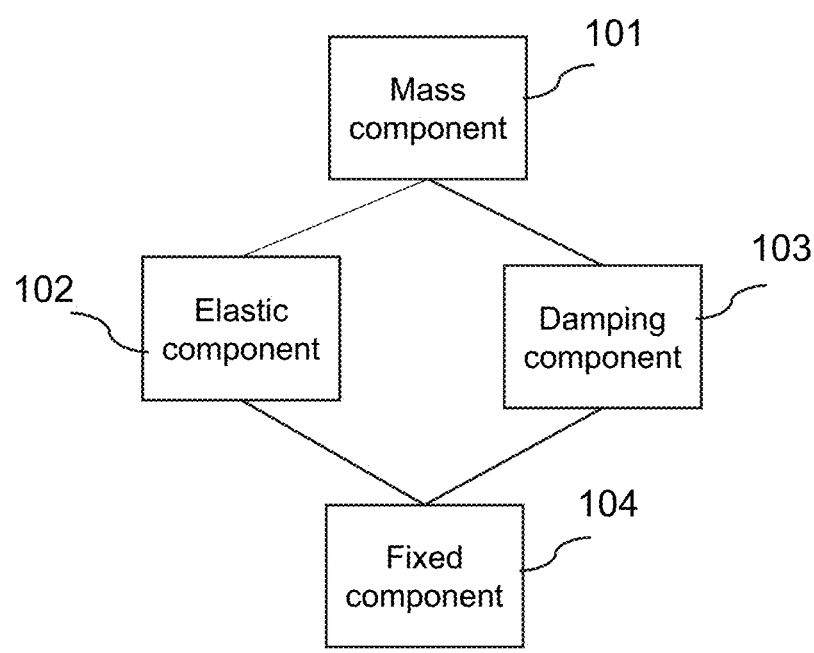
FIG. 1 illustrates an exemplary frame diagram of an impedance apparatus 100 according to some embodiments of the present disclosure.

In order to more clearly illustrate the technical solutions of the embodiments of the present disclosure, the following will briefly introduce the drawings that need to be used in the description of the embodiments. Obviously, the drawings in the following description are only some examples or embodiments of the disclosure. For those of ordinary skill in the art, without creative work, the disclosure can be applied to other similar scenarios according to these drawings. Unless it is obvious from the language environment or otherwise stated, the same reference numbers in the drawings represent the same structure or operation.

It should be understood that the "system", "device", "unit" and/or "module" used herein is a method for distinguishing different components, elements, parts, parts, or assemblies of different levels. However, if other words can achieve the same purpose, the words can be replaced by other expressions.

As shown in the present disclosure and the claims, unless the context clearly suggests exceptional circumstances, the words "a", "an", "an" and/or "the" do not only specifically refer to the singular, but also include the plural. Generally speaking, the terms "including" and "contain" only suggest that the operations and elements that have been clearly identified are included, and these operations and elements do not constitute an exclusive list, and the method or device may also include other operations or elements.

The embodiments of the present disclosure describe an impedance apparatus. In some embodiments, the impedance apparatus may include a mass component, an elastic component, and a fixed component. The mass component may be connected with the fixed component through the elastic component. The mass component may be used to provide a mass, and when the external vibration unit is coupled with the mass component, the mass component may simulate a mass load fed back by the head to the vibration unit. A vibration unit may refer to an element capable of generating a vibration signal. In some embodiments, the vibration unit may be applied in an audio device (e.g., a speaker, an earphone, a player, etc.), and the vibration unit converts an audio signal into a vibration signal. In some embodiments, the vibration unit may also be applied in a hearing device (e.g., a hearing aid, etc.). The elastic component may be used to provide elasticity for the movement of the mass component, which may simulate the elasticity of the head skin. In some embodiments, the impedance apparatus may further include a damping component. The damping component may be used to simulate the damping of the head to the vibration unit. In some embodiments, the damping component is located between the mass component and the fixed component and provides damping for the movement of the mass component relative to the fixed component. When the mass component is in contact with the external vibration unit, the mass component receives the vibration of the vibration unit and moves relative to the fixed component.

By adjusting parameters of the mass component, the elastic component, and/or the damping component in the impedance apparatus, the effect of different regions of the head on the vibration unit may be simulated by the impedance apparatus. In some embodiments, in order to simulate the effect of a facial region on the front side of the human head auricle (also be referred to as a vicinity of a tragus region) on the vibration unit, the parameters of the mass component, the elastic component, and/or the damping component in the impedance apparatus may be adjusted as: when a pressure between the mass component and the vibration unit is in the range of 0.05 N-3.5 N, the impedance apparatus provides the vibration unit with a mechanical impedance in the range of 6 dB-50 dB. As daily fitted in the vicinity of the tragus region, the pressure in the range of 0.05 N-3.5 N is a relatively comfortable pressure that the human body may adapt to. The impedance apparatus feeds back a mechanical impedance in the range of 6 dB to 50 dB to the vibration unit in response to the pressure in the above range applied by the vibration unit, thereby, the actual impedance fed back to the vibration unit formed by the vicinity of the tragus region during actual use may be simulated. In some embodiments, a mechanical impedance frequency response curve of the impedance apparatus has a valley in a specific frequency range (e.g., 50 Hz-500 Hz), that is, the mechanical impedance of the impedance apparatus has a minimum value (also be referred to as a valley value) in the specific frequency range. In addition, when the frequency is less than the frequency corresponding to the valley value, the mechanical impedance of the impedance apparatus decreases as the frequency increases; when the frequency is greater than the frequency corresponding to the valley value, the mechanical impedance of the impedance apparatus increases as the frequency increases. In some embodiments, the specific frequency range is not limited to the above-mentioned 50 Hz-500 Hz. In some embodiments, the specific frequency range may also be other frequency ranges such as 60 Hz-400 Hz, 70 Hz-300 Hz, 80 Hz-200 Hz, or any frequency value in the range. In some embodiments, the parameters of the mass component, the elastic component, and/or the damping component of the impedance apparatus may be adjusted so that the mechanical impedance provided by the impedance apparatus is consistent or approximately consistent with the mechanical impedance in the vicinity of the tragus region of the head. For example, in some embodiments, the damping of the impedance apparatus may be adjusted so that the valley value of mechanical impedance provided by the impedance apparatus is consistent or approximately consistent with the valley value of mechanical impedance in the vicinity of the tragus region of the head. As another example, in some embodiments, the mass of the mass component and the elastic coefficient of the elastic component may be adjusted so that the frequency corresponding to the valley value is within a specific frequency range.

It should be noted that the pressure between the mass component and the vibration unit may not be within the above-mentioned range, for example, less than 0.05 N or greater than 3.5 N. In addition, the mechanical impedance provided by the impedance apparatus to the vibration unit is not limited to the above-mentioned range. For example, the impedance apparatus may provide a mechanical impedance of 58 dB to the vibrating unit. As another example, the impedance apparatus may provide a mechanical impedance of 3 dB to the vibration unit. Regarding the pressure between the mass component and the vibration unit, and the parameters of the mass component, the elastic component, and the damping component, please refer to the contents described elsewhere in the present disclosure.

FIG. 1 illustrates an exemplary frame diagram of an impedance apparatus 100 according to some embodiments of the present disclosure. As shown in FIG. 1, the impedance apparatus 100 may include a mass component 101, an elastic component 102, a damping component 103, and a fixed component 104. In some embodiments, the mass component 101 may be connected with the fixed component 104 through the elastic component 102. In some embodiments, the mass component 101 may be connected with the fixed component 104 in a physical connection through the elastic component 102. The physical connection described in the present disclosure may include welding, snap-fitting, gluing or integral molding, or the like, or any combination thereof.

In some embodiments, when the mass component 101 is in contact with or coupled with an external vibration unit, the mass component 101 receives the vibration of the vibration unit and moves relative to the fixed component 104. In some embodiments, the mass component 101 may be in direct contact with or directly coupled with the vibration unit, and the vibration unit directly pushes the mass component 101 to move when the vibration unit generates vibration. In some embodiments, the mass component 101 may be in contact with or directly coupled with the vibration unit through other structures or components (e.g., a protective film, etc.), and the mass component 101 receives the vibration of the vibration unit to move. In some embodiments, when a pressure between the mass component 101 and the vibration unit is in the range of 0.05 N-3.5 N, the impedance apparatus 100 may provide the vibration unit with a mechanical impedance in the range of 6 dB-50 dB. The pressure in the range of 0.05 N-3.5 N is an appropriate pressure in the vicinity of the tragus region of the head, and the mechanical impedance in the range of 6 dB-50 dB simulates an actual impedance fed back to the vibration unit in the vicinity of the tragus region in actual use. In some embodiments, when the impedance apparatus 100 is used to simulate the mechanical impedance of other parts of the human head, the pressure between the mass component 101 and the vibration unit may be less than 0.05 N or greater than 3.5 N.

The mass component 101 may refer to an object having a certain weight. In the impedance apparatus 100, the mass component 101 may be used to represent a mass load fed back to the vibration unit in the vicinity of the tragus region of the head. The mass component 101 is also referred to as an inertial component. When the vibration unit is in connection with the mass component 101, the vibration unit pushes the mass component 101 to move together during a vibration process. At this time, the mass component 101 and the vibration unit maintain the same phase and have the same or approximately the same vibration acceleration. In some embodiments, the shape of the mass component 101 may include, but is not limited to, a regular structure such as a cylinder, a cuboid, a cone, a truncated cone, a sphere, or the like, or an irregular structure. In some embodiments, the material of the mass component 101 may include, but is not limited to, any rigid material such as plastic, wood, or metal, or the like. In some embodiments, in order to make the mechanical impedance of the impedance apparatus within the range of 6 dB-50 dB, the mass of the mass component 101 may be in the range of 0.5 g-5 g. Preferably, the mass of the mass component 101 may be in the range of 0.6 g-4.5 g. More preferably, the mass of the mass component 101 may be in the range of 0.8 g-4 g. More preferably, the mass of the mass component 101 may be in the range of 1 g-3.6 g. More preferably, the mass of the mass component 101 may be in the range of 1.5 g-3 g. More preferably, the mass of the mass component 101 may be in the range of 2 g-2.5 g.

The fixed component 104 may refer to a carrier of the impedance apparatus 100, and may be used to carry other components of the impedance apparatus 100 (e.g., the mass component 101, the elastic component 102, and the damping component 103). In some embodiments, the structure of the fixed component 104 may include, but is not limited to, a plate structure, a casing structure, a block structure, a desktop structure, or the like. It should be noted that the fixed component 104 is not limited to the above-mentioned structure, and the fixed component 104 may be a structure of any shape, as long as it is a structure capable of carrying the other components (e.g., the mass component 101, the elastic component 102, and the damping component 103) of the impedance apparatus 100, and there is no further limitation.

The elastic component 102 may be used to provide a certain elasticity for the movement of the mass component 101. The magnitude of an elastic force of the elastic component 102 is proportional to the movement displacement or movement amplitude of the mass component 101. For example, the elastic component 102 is deformed during the movement of the mass component, and the elastic force of the elastic component 102 is related to the deformation of the elastic component 102. The greater the deformation is, the larger the elastic force provided by the elastic component 102 is. The elastic coefficient of the elastic component 102 may be used to represent an equivalent elastic coefficient of the vicinity of the tragus region of the human head. In some embodiments, the elastic coefficient of the elastic component 102 may be adjusted to be approximately equal to the equivalent elastic coefficient of the vicinity of the tragus region of the human head. In some embodiments, the elastic coefficient of the elastic component 102 may be adjusted based on the hardness of the vicinity of the tragus region of the human head, an age of the wearer, a pressure when wearing the vibration unit, and a type of cells at the position. The specific reasons are as follows, the hardness of different parts of the human head are different, and the equivalent elastic coefficients of different parts of the human head are also different. For example, the forehead part of the human head and the mastoid part behind the ear are relatively hard, and their equivalent elastic coefficients are relatively large. As another example, the temporal bone part in front of the ear of the human head (that is, in the vicinity of the tragus region) is softer than the forehead part and the mastoid part behind the ear, and the equivalent elastic coefficient of the temporal bone part is relatively small. In addition, the Young's modulus of elastin and collagen in different cells of the human head are different (e.g., Young's modulus of elastin E≈0.3 MPa, Young's modulus of collagen E=100~1000 MPa). Therefore, different cells have different effects on the equivalent elastic coefficients of different regions of the human head. In addition, the same part of the same person has different equivalent elastic coefficients at different ages. For example, after the human body ages, due to the decreases in the amount of subcutaneous fluid, the equivalent elastic coefficient may increase accordingly. In some embodiments, the equivalent elastic coefficient of the human head skin is also related to the pressure between the vibration unit and the head skin when the user wears the vibration unit. For example, when a user wears a device containing a vibration unit (e.g., a hearing device, audio device, etc.), after a pressure imposed between the device and the skin of the human head, the device squeezes the subcutaneous cells of the human body, which may affect the amount of subcutaneous liquid corresponding to the device. The greater the pressure, the less the amount of subcutaneous liquid corresponding to the device, and the larger the corresponding equivalent elastic coefficient. In order to simulate the characteristic that the equivalent elastic coefficient of the human head skin changes with pressure, in some embodiments, the elastic coefficient of the elastic component 102 may be set to change with the movement displacement or movement amplitude of the mass component 101. For example, as the movement amplitude of the mass component 101 increases, the elastic coefficient of the elastic component 102 increases accordingly. In order to make the elastic coefficient of the elastic component 102 to be equal or approximately equal to the equivalent elastic coefficient of the vicinity of the tragus region of the head, in some embodiments, the elastic coefficient of the elastic component 102 may be in the range of 600 N/m to 5000 N/m. Preferably, the elastic coefficient of the elastic component 102 may be in the range of 700 N/m to 4500 N/m. More preferably, the elastic coefficient of the elastic component 102 may be in the range of 800 N/m to 4000 N/m. Preferably, the elastic coefficient of the elastic component 102 may be in the range of 850 N/m to 3500 N/m. Preferably, the elastic coefficient of the elastic component 102 may be in the range of 900 N/m to 1700 N/m. Preferably, the elastic coefficient of the elastic component 102 may be in the range of 1000 N/m to 1500 N/m. Preferably, the elastic coefficient of the elastic component 102 may be in the range of 1100 N/m to 1400 N/m. In some embodiments, the elastic component 102 may include, but is not limited to, a spring, an elastic soft rubber or silicone, a plastic with an elastic structure, a metal with an elastic structure, etc., or other elastic forms (e.g., an air cushion). In some embodiments, the spring includes, but is not limited to, one or more of a compression spring, an extension spring, a torsion spring, a coil spring, or a leaf spring. In some embodiments, the elastic component 102 may also be a fluid (e.g., gas, liquid, or a combination of gas and liquid, etc.). When the fluid is forced by an external force (for example, the pressure on the fluid when the mass component 101 vibrates), the fluid produces a certain movement resistance (i.e., viscosity) to the mass component 101, so as to provide some flexibility for the movement of the mass component 101.

The damping component 103 may be used to provide damping to the movement of the mass component 101. The damping component 103 may represent an equivalent damping of the human body. In order to make the damping provided by the damping component 103 to be equal or approximately equal to the equivalent damping of the vicinity of the tragus region of the head, in some embodiments, the damping of the damping component 103 may be in the range of 1-4. More preferably, the damping of the damping component 103 may be 1-3. More preferably, the damping of the damping component 103 may be in the range of 1-2. In some embodiments, the damping component 103 may include, but is not limited to, one or more of a spring damper, a hydraulic damper, a friction damper, an impulse damper, a rotational damper, a viscous damper, an airflow damper, a damping hinge, a damping slide rails, or the like. In some embodiments, the damping component 103 may be realized by using properties of a certain media (e.g., a liquid with a certain viscous force, such as a magnetic fluid).

In some embodiments, one of the mass component 101, the elastic component 102, and the damping component 103 may simultaneously provide a mass effect, an elastic effect, or a damping effect. In some embodiments, the mass component 101 and the elastic component 102 may be provided by the same component. For example, an elastic silicone block may serve as the mass component 101 and the elastic component 102 at the same time. In some embodiments, the mass component 101 and the damping component 103 may be provided by the same component. For example, the fixed component 104 has an opening with the same shape as the mass component 101. When a side wall of the mass component 101 is in contact with an inner wall of the fixed component 104, a friction force between the mass component 101 and the fixed component 104 may be used as the damping of the impedance apparatus 100. In some embodiments, the elastic component 102 and the damping component 103 may be provided by the same component. For example, a spring filled or wrapped with foams acts as both the elastic component 102 and the damping component 103.

It should be noted that the above description about the impedance apparatus 100 is only for exemplary illustration, and does not limit the scope of the present disclosure. For those skilled in the art, various modifications and changes may be made to the impedance apparatus 100 under the guidance of the present disclosure, such as omitting the elastic component 102 or the damping component 103, and these modifications and changes are still within the scope of the present disclosure.

Figure 2:
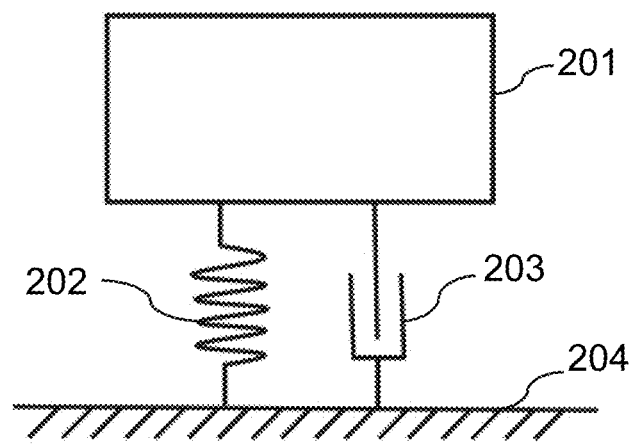
FIG. 2 illustrates a schematic structural diagram of an impedance apparatus 200 according to some embodiments of the present disclosure.

FIG. 2 illustrates a schematic structural diagram of an impedance apparatus 200 according to some embodiments of the present disclosure. As shown in FIG. 2, the impedance apparatus 200 may include a mass component 201, an elastic component 202, a damping component 203, and a fixed component 204. The fixed component 204 may be used as a support carrier for other components (e.g., the mass component 201, the elastic component 202, and the damping component 203) of the impedance apparatus 200. The fixed component 204 may be a plate-like structure, a block-like structure, a casing structure, or other regular and irregular shapes. In some embodiments, the fixed component 204 may include a fixed arm, which may be a partial structure or an integral structure of the fixed component 204. For example, when the fixed component 204 is a plate-like structure, the plate-like structure may be a fixed arm. As another example, when the fixed component 204 is a casing structure, the fixed arm may be a side wall of the casing structure. In some embodiments, the mass component 201 is disposed opposite to the fixed arm, one side of the mass component 201 faces the fixed arm, and the other side of the mass component 201 faces away from the fixed arm. The elastic component 202 may be located between the mass component 201 and the fixed arm to support the mass component 201, so that the mass component 201 moves relative to the fixed component under an external action (e.g., the vibration of the vibration unit). In some embodiments, the elastic component 202 may be a columnar structure with two ends, wherein the first end of the elastic component 202 is connected with the mass component 210, and the second end of the elastic component 202 is connected with the fixed arm. In some embodiments, the damping component 203 may be located between the mass component 201 and the fixed arm, wherein the first end of the damping component 203 is connected with the mass component 201, and the second end of the damping component 203 is connected with the fixed arm. In some embodiments, the damping component 203 may include at least one of a spring damper, a hydraulic damper, a friction damper, a pulse damper, a rotary damper, a viscous damper, an airflow damper, a damping hinge, a damping slide rail kind, etc.

It should be noted that the above description about the impedance apparatus 200 is only for exemplary illustration, and the count of the mass component, the elastic component, and the damping component of the impedance apparatus 200 is not limited to the above one, but may also be multiple. For example, a count of the elastic components may be multiple, and the multiple elastic components may be connected in series with each other. In addition, by adjusting the count of the elastic components of the impedance apparatus 200, the elastic coefficient of the whole elastic component may be within the range of 600 N/m-5000 N/m mentioned above.

Figure 3:
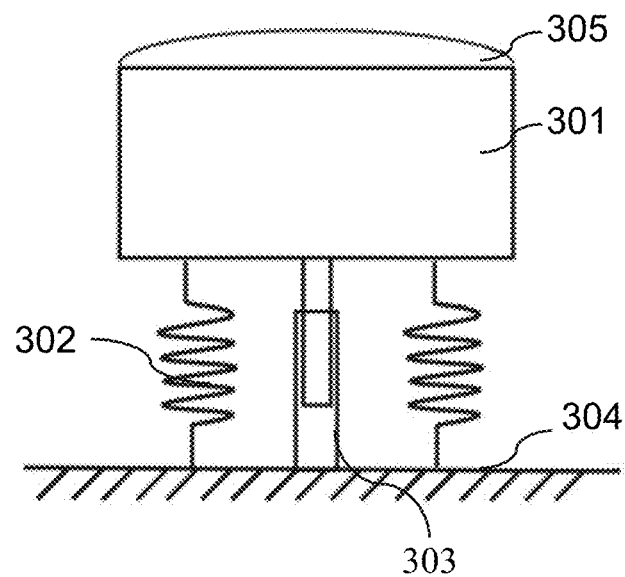
FIG. 3 illustrates a schematic structural diagram of an impedance apparatus 300 according to some embodiments of the present disclosure.

FIG. 3 illustrates a schematic structural diagram of an impedance apparatus 300 according to some embodiments of the present disclosure. The overall structure of the impedance apparatus 300 shown in FIG. 3 is substantially the same as that of the impedance apparatus 200 shown in FIG. 2, and the difference is that in the impedance apparatus 300 shown in FIG. 3, a side of the mass component 301 away from the fixed component 304 has a protective layer 305. The protective layer 305 may prevent the mass component 301 from directly contacting the vibration unit, thereby preventing the vibration unit from wearing out. In some embodiments, the protective layer 305 may be a metal protective layer, a fabric protective layer, a silicone protective layer, a soft rubber protective layer, etc., or any combination thereof. In addition, a count of the elastic components 302 in the impedance apparatus 300 shown in FIG. 3 is different from a count of the elastic components 202 in the impedance apparatus 200 shown in FIG. 2. In some embodiments, the count of the elastic components 302 may be two or more. When the elastic components 302 includes multiple elastic components 302, the multiple elastic components 302 may be located between the mass component 301 and the fixed component 304. In some embodiments, the multiple elastic components 302 may be elastic elements with the same or different specifications (e.g., length, elastic coefficient, etc.). When the specifications of the multiple elastic components 302 are the same, the multiple elastic components 302 may be uniformly distributed along a side surface of the mass component 301 facing the fixed component 304. When the specifications of the elastic components 302 are different, for example, the lengths of the elastic components 302 are different, the two ends of an elastic component 302 with the longer length are connected with the fixed component 304 and the mass component 301 respectively, and the elastic elements with the shorter length may be combined in series to form one elastic component 302, and two ends of the elastic component 302 formed by the series of multiple elastic elements are connected to the fixed component 304 and the mass component 301 respectively. It should be noted that the count of the elastic components 302 is not limited to the two shown in FIG. 3, and may also be three, four, five or more than five. Other structures and components of the impedance apparatus 300 (for example, the damping component 303 and the fixed component 304) are the same as or similar to those of the impedance apparatus 200 described in FIG. 2. For more details, please refer to the description in FIG. 2, which will not be repeated here.

Figure 4:
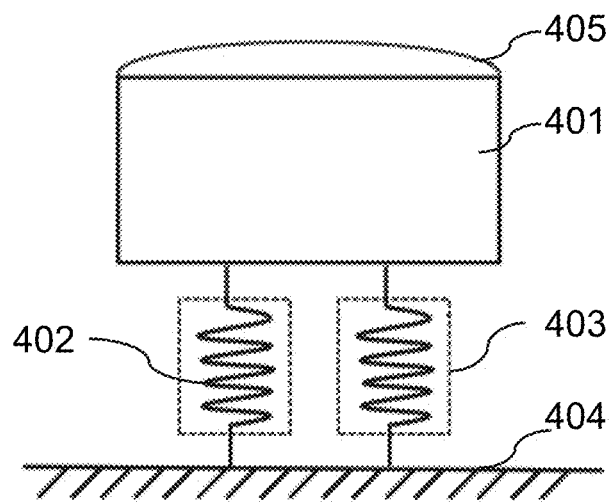
FIG. 4 illustrates a schematic structural diagram of an impedance apparatus 400 according to some embodiments of the present disclosure.

In some embodiments, the elastic component and the damping component of the impedance apparatus may be provided by the same component. For more details, please refer to FIG. 4 and related descriptions below. FIG. 4 illustrates a schematic structural diagram of an impedance apparatus 400 according to some embodiments of the present disclosure. As shown in FIG. 4, the elastic component 402 may include one or more springs, and the springs are located between the mass component 401 and the fixed component 404 to connect the mass component 401 and the fixed component 404. In some embodiments, a substance with damping properties may be filled in or around the spring, and the substance with damping properties may provide damping for the spring, so that the filled spring may serve as both an elastic component and a damping component. In some embodiments, the damping component 403 may be an elastic material such as foam, sponge, rubber, silicone, etc. Other structures and components of the impedance apparatus 400 (e.g., the fixed component 404 and the protective layer 405) are the same as or similar to some of the structures and components of the impedance apparatus 300 described in FIG. 3. For more details, please refer to the description in FIG. 3, which will not be repeated here.

Figure 5:
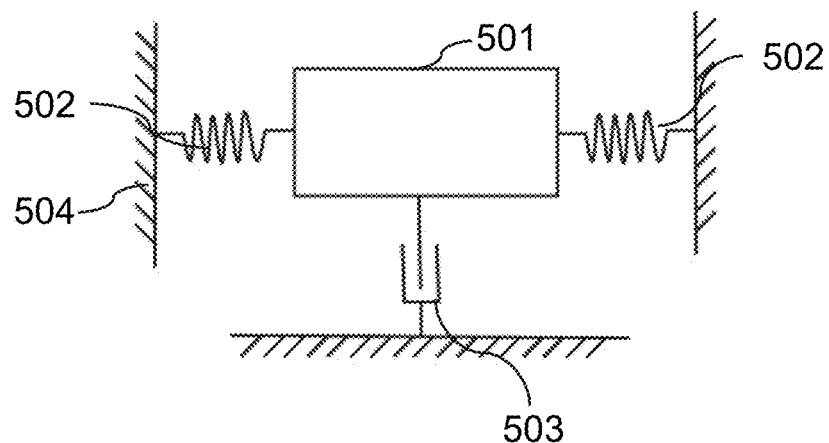
FIG. 5 illustrates a schematic structural diagram of an impedance apparatus 500 according to some embodiments of the present disclosure.

FIG. 5 illustrates a schematic structural diagram of an impedance apparatus 500 according to some embodiments of the present disclosure. As shown in FIG. 5, the impedance apparatus 500 may include a mass component 501, an elastic component 502, a damping component 503, and a fixed component 504. In some embodiments, the fixed component 504 may be a casing structure with one end open, and the mass component 501 is suspended at the opening of the casing structure through the elastic component 502, so that the mass component 501 may be coupled or contacted with the vibration unit or the vibration unit through the opening of the fixed component 504.

In some embodiments, the fixed component 504 may include a first side wall, a second side wall, and a third side wall, wherein there is a distance between the first side wall and the second side wall to form an opening of the casing structure, and the third side wall is opposite to the opening. The mass component 501 is a columnar structure, a side wall of the mass component 501 is connected with the first side wall and the second side wall of the fixed component 504 through the elastic component 502, and a side of the mass component 501 facing the third side wall is connected with the third side wall through the damping component 503. In some embodiments, part of the structure of the mass component 501 may protrude from the opening of the fixed component 504, or the entire structure of the mass component 501 is below the plane where the opening is located, or the side of the mass component 501 facing away from the third side wall is in the same plane as the plane where the opening is located. It should be noted that the first side wall, the second side wall, and the third side wall of the fixed component 504 here are only for the convenience of describing the fixed component 504. In some embodiments, the first side wall and the second side wall may be different side walls. For example, when the fixed component 504 has a cubic structure, the first side wall and the second side wall may be two opposite side walls in the cubic structure. In some embodiments, the first side wall and the second side wall may be the same side wall. For example, when the fixed component 504 has a cylindrical structure, the first side wall and the second side wall are different components of the side wall of the cylinder. In addition, the side wall of the fixed component 504 is not limited to the above-mentioned first side wall and second side wall, and may also include other side walls, such as a fourth side wall, a fifth side wall, etc., and the side wall of the mass component 501 may be connected with other side walls through the elastic component 502, or the side wall of the mass component 501 may not be connected with other side walls.

In some embodiments, the elastic component 502 may include a first end and a second end. The first end of the elastic component 502 is connected with the side wall of the mass component 501, and the second end of the elastic component 502 is connected with an inner wall of the casing structure. In some embodiments, a count of the elastic components 502 may be multiple, and the multiple elastic components 502 may be distributed along the side wall of the mass component 501 at intervals.

It should be noted that the impedance apparatus shown in FIG. 2-FIG. 5 are only for exemplary description, and do not limit the scope of the present disclosure. For those skilled in the art, various modifications and changes may be made to the impedance apparatus under the guidance of the present disclosure, such as changing the implementation of the mass component or changing the implementation of the elastic component, and these modifications and changes are still within the scope of the present disclosure.

Figure 6:
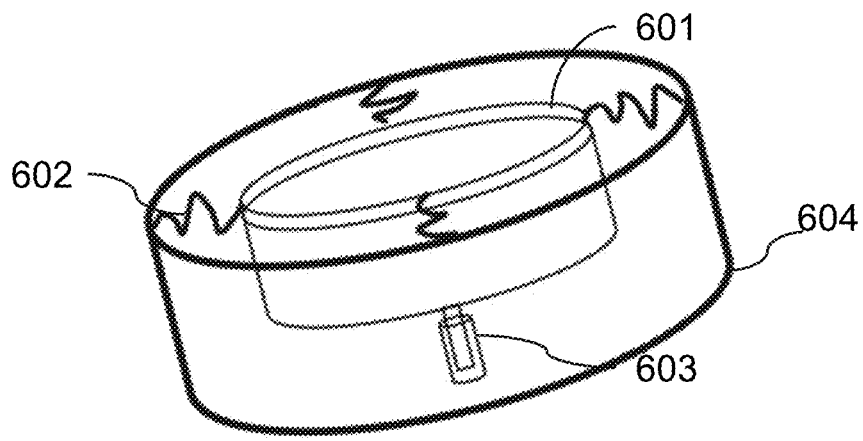
FIG. 6 illustrates a schematic structural diagram of an impedance apparatus 600 according to some embodiments of the present disclosure.

FIG. 6 illustrates a schematic structural diagram of an impedance apparatus 600 according to some embodiments of the present disclosure. As shown in FIG. 6, the fixed component 604 may be a casing structure with one end open. A count of the elastic components 602 may be multiple, and the multiple elastic components 602 are distributed along the side wall of the mass component 601 at intervals.

In some embodiments, the fixed component 604 may be a cylindrical casing structure with one end open. The casing structure has a cavity, and the cavity may accommodate the mass component 601, the elastic component 602, and the damping component 603. The cavity is communicated with the opening, and the top of the mass component 601 may be coupled or contacted with the vibration unit through the opening of the fixed component 604. In some embodiments, a distance between the side wall of the mass component 601 and the inner wall of the fixed component 604 may or may not be the same everywhere.

In some embodiments, the damping portion 603 may be located between the mass component 601 and the bottom wall of the casing structure. In some embodiments, one end of the damping component 603 is connected with one side of the mass component 601, and the other end of the damping component 603 is connected with the bottom wall of the casing structure. In some embodiments, the damping component 603 may be a damper, which is supported between the bottom of the mass component 601 and the bottom wall of the casing structure.

In some embodiments, a first end of the elastic component 602 is connected with the side wall of the mass component 601, and a second end of the elastic component 602 is connected with the inner wall of the casing structure. In some embodiments, elastic forces of the multiple elastic components 602 acting on the mass component 601 or the fixed component 604 may be equal or unequal. In some embodiments, the elastic component 602 may include at least one of a compression spring, an extension spring, a torsion spring, a coil spring, a leaf spring, etc.

In order to prevent foreign objects from entering the impedance apparatus 600 and affecting the accuracy of the impedance apparatus 600, in some embodiments, the impedance apparatus 600 may further include a blocking component (not shown in FIG. 6), and the blocking component may be located between the side wall of the mass component 601 and the inner wall of the fixed component 604. The side wall of the blocking component is connected with the inner wall of the fixed wall. In some embodiments, the blocking component may include a hole matching the shape of the mass component 601, and the mass component 601 may be located at the hole of the blocking component 601. In some embodiments, the size of the hole may be greater than the size of the mass component so that the mass component 601 may vibrate at the hole of the blocking component. In some embodiments, the shape of the blocking component is adapted to the shape of a space formed by the side wall of the mass component 601 and the fixed component 604. For example, when the fixed component 604 and the mass component 601 are both cylindrical structures, the blocking component may be an annular structure. As another example, when the fixed component 604 has a cylindrical structure and the mass component 601 has a rectangular parallelepiped structure, the overall shape of the blocking component may be a cylindrical structure with a rectangular orifice. It should be noted that, in some embodiments, the mass component 601 may also be connected with the blocking component through the elastic component 602.

Figure 7:
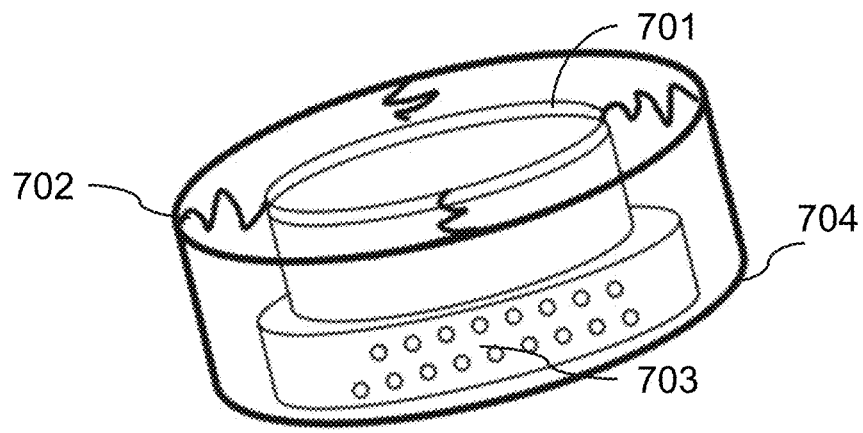
FIG. 7 illustrates a schematic structural diagram of an impedance apparatus 700 according to some embodiments of the present disclosure.

In some embodiments, the damping portion may be any object having damping properties. FIG. 7 illustrates a schematic structural diagram of an impedance apparatus 700 according to some embodiments of the present disclosure. As shown in FIG. 7, the damping component 703 is located between the bottom of the mass component 701 and the bottom of the fixed component 704. The damping component 703 may be any object that has damping characteristics, for example, a foam or a fluid with a certain viscous force (e.g., a magnetic fluid, a liquid), etc. The mass component 701, the elastic component 702, and the fixed component 704 are the same or similar to some structures and components of the impedance apparatus described in FIG. 6. For more details, please refer to the description in FIG. 6, which will not be repeated here.

Figure 8:
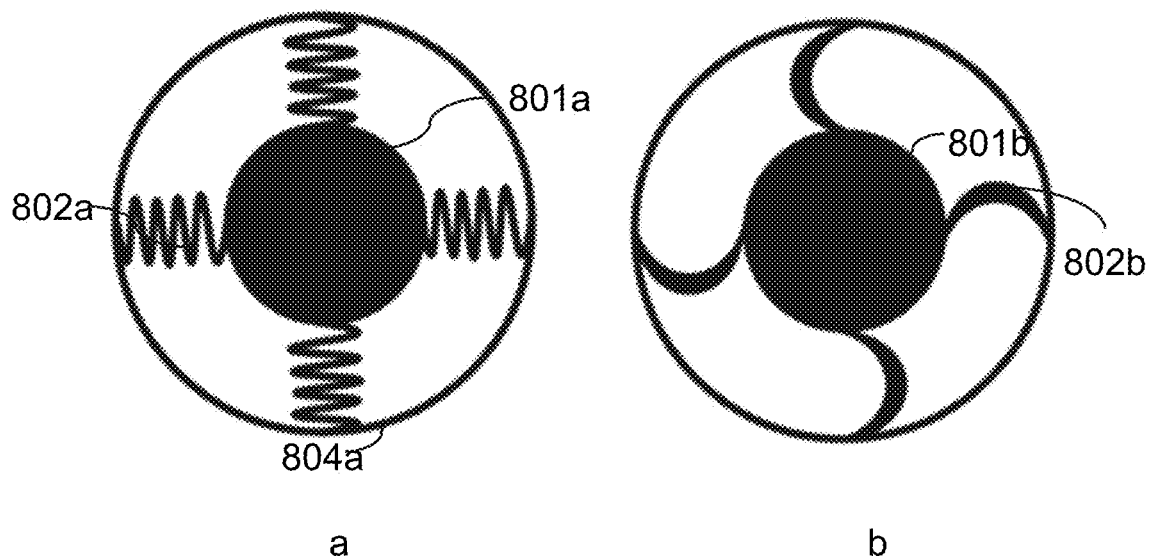
FIG. 8 illustrates a top view of a structure of an impedance apparatus 800 according to some embodiments of the present disclosure.

In order to describe the distribution and the specific structure of the elastic component more clearly, the elastic component may now be further described with reference to FIG. 8 and FIG. 9. FIG. 8 illustrates a top view of the structure of an impedance apparatus 800 according to some embodiments of the present disclosure.

As shown in FIG. 8a, in some embodiments, the elastic components 802a may be four springs (e.g., at least one of a compression spring, an extension spring, a torsion spring, a coil spring, or a leaf spring). The four elastic components 802a are evenly spaced along the side wall of the mass component 801a. In some embodiments, the distance between any portion of the side wall of the mass component 801a and the inner wall of the fixed component 804a may be the same. Here, by using the same elastic component 802a, an elastic force generated by each elastic component 802a may be kept the same during the vibration of the mass component 801a, so that each elastic component 802a may have the same service life, and improve the accuracy of the impedance apparatus in the test. It should be noted that the count of the elastic components 802a is not limited to the four shown in FIG. 8a, but may also be two, three, five, or more. In addition, multiple elastic components 802a may include different types of springs. For example, among the four springs shown in FIG. 8a, the two springs arranged vertically are compression springs, and the two springs arranged horizontally are coil springs.

As shown in FIG. 8b, in some embodiments, the elastic component 802b may be an arc-shaped spring leaf, and multiple elastic components 802b are evenly spaced along the side wall of the mass component 801b. It should be noted that the shape of the spring leaf is not limited to the above-mentioned arc-shaped, and may also be other shapes, such as straight, triangular, "V," "Z," spiral, or other regular and irregular shapes. Other structures and components of the impedance apparatus 800 are the same as or similar to some of the structures and components of the impedance apparatus 600 described in FIG. 6. For more details, please refer to the description in FIG. 6, which will not be repeated here.

Figure 9:
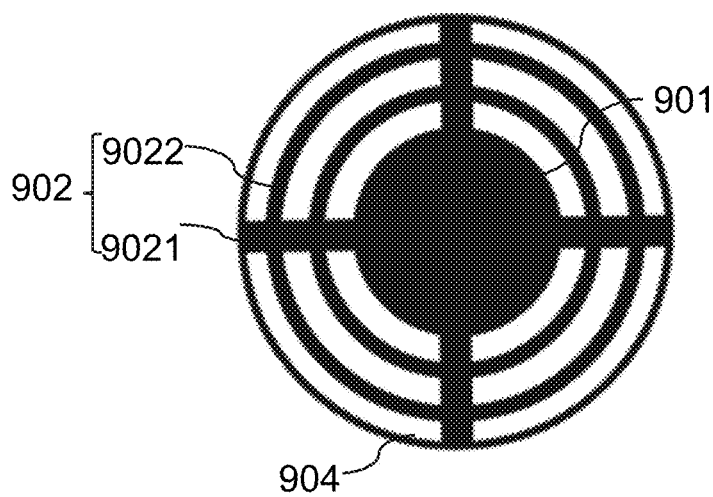
FIG. 9 illustrates a top view of a structure of an impedance apparatus 800 according to some embodiments of the present disclosure.

FIG. 9 illustrates a top view of the structure of an impedance apparatus 800 according to some embodiments of the present disclosure. As shown in FIG. 9, the elastic component 902 of the impedance apparatus 900 may be a mesh structure, and the mesh structure may include multiple elastic elements 9021 (e.g., springs, reeds, etc.) and multiple annular structures 9022. The multiple elastic elements 9021 are distributed along the side wall of the mass component 901 at intervals, and the multiple annular structures 9022 are distributed at intervals around the mass component 901, wherein the multiple annular structures 9022 are connected with the elastic element 9021. The mesh structure hangs the mass component 901 at the opening of the fixed component 904. In some embodiments, an inner ring of the mesh structure is connected with the side wall of the mass component 901, and an outer ring of the mesh structure is connected with the inner wall of the fixed component 904. The inner ring of the mesh structure refers to a side of the mesh structure close to the side wall of the mass component 901, and correspondingly, the outer ring of the mesh structure refers to a side of the mesh structure away from the side wall of the mass component 901. In some embodiments, the shape of the elastic element 9021 in the mesh structure may be a regular or irregular shape such as a rectangle, a triangle, a circular arc, a V-shape, etc. It should be noted that the annular structure 9022 in the mesh structure may also be in other shapes, for example, any shape such as a square, a triangle, a pentagon, and a hexagon, etc. In addition, the count of the annular structures 9022 is not limited to the two shown in FIG. 9, but may also be one, three or more. When the count of the annular structures 9022 is multiple, the shapes of the annular structures 9022 may be the same or different. Other structures and components of the impedance apparatus 900 are the same as or similar to some of the structures and components of the impedance apparatus 800 described in FIG. 8. For more details, please refer to the description in 8, which will not be repeated here. In addition, the partial structures in the mesh structure shown in FIG. 9 (e.g., the elastic element 9021 and the ring structure 9022) may also be applied to the impedance apparatus shown in FIG. 5-FIG. 8.

In the impedance apparatuses shown in FIG. 2-FIG. 9, the parameters of the mass component, the elastic component, and the damping component may be referenced to FIG. 1 and its related descriptions. For example, the parameters of the mass component, the elastic component, and the damping component may be adjusted so that when an external force applied to the mass component is 0.05 N-3.5 N, the mechanical impedance of the impedance apparatus is in the range of 6 dB-50 dB. For example, the mechanical impedance of the impedance apparatus under a specific external force may be changed by adjusting the count of springs and the elastic coefficient of the elastic component, the count and damping of the damping elements of the damping component, and the mass of the mass component.

Figure 10:
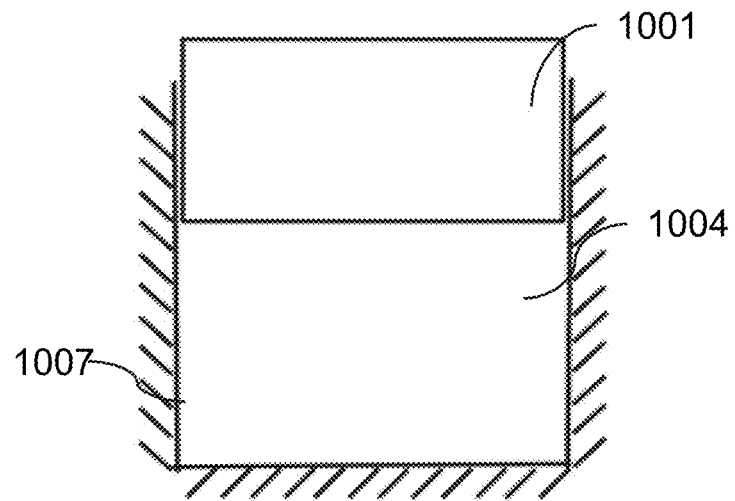
FIG. 10 illustrates a schematic structural diagram of an impedance apparatus 1000 according to some embodiments of the present disclosure.

FIG. 10 illustrates a schematic structural diagram of an impedance apparatus 1000 according to some embodiments of the present disclosure. As shown in FIG. 10, the fixed component 1004 may be a casing structure with one end open. A sealed cavity 1007 may be enclosed between the mass component 1001 and the casing structure, and the gas in the sealed cavity 1007 may form an elastic component. In some embodiments, there is a friction force between the side wall of the mass component 1001 and the inner wall of the casing structure. The friction force may form a damping component, and the friction force between the casing structure and the mass component 1001 provides a certain damping for the movement of the mass component 1001.

In the impedance apparatus 1000 shown in FIG. 10, when the external force exerted on the mass component 1001 is in the range of 0.05 N-3.5 N, the mass of the mass component 1001, the friction coefficient between the mass component 1001 and the casing structure, or the pressure of the gas filled within the sealed cavity 1007 may be adjusted so that the mechanical impedance of the impedance apparatus 1000 is within a target range (e.g., 6 dB-50 dB). In some embodiments, an elastic element (e.g., a spring) for connecting the bottom wall of the casing structure to the mass component 1001 may also be added in the sealed cavity 1007 to adjust the mechanical impedance of the impedance apparatus 1000.

It should be noted that the impedance apparatuses shown in FIG. 6 to FIG. 10 are only for exemplary description, and do not limit the scope of the present disclosure. For those skilled in the art, various modifications and changes may be made to the impedance apparatus under the guidance of the present disclosure, such as changing the shape of the mass component and the fixed component, or wrapping the elastic component at the side wall of the mass component with foam, etc. These modifications and changes are still within the scope of this manual.

In some embodiments, the impedance apparatus may be used to simulate mechanical impedance of the vicinity of the tragus region of the head. The mechanical impedance of the vicinity of the tragus region of the head refers to the motion response of the vicinity of the tragus region of the head under external force excitation. The motion response may include at least one of displacement response, velocity response, acceleration response, etc. For the purpose of illustration, the external force may be an excitation force provided by the vibrating unit when the vibrating unit vibrates, and the motion response is the velocity response. In some embodiments, the mechanical impedance of the vicinity of the tragus region of the head may be represented as a ratio of the excitation force to the magnitude of the velocity response, expressed as follows:

$$Z = \frac{F}{v}, \tag{1}$$

where F denotes the excitation force provided by the vibration unit, v denotes the velocity response, and Z denotes the mechanical impedance of the vicinity of the tragus region of the head. The greater the mechanical impedance of the vicinity of the tragus region of the head, the smaller the magnitude of the velocity response.

Figure 11:
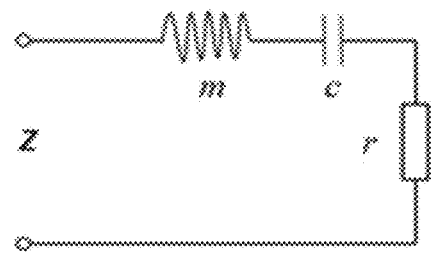
FIG. 11 illustrates a diagram of an analog circuit model of the mechanical impedance of an impedance apparatus according to some embodiments of the present disclosure.

FIG. 11 illustrates a diagram of an analog circuit model of the mechanical impedance of an impedance apparatus according to some embodiments of the present disclosure. In the mechanical impedance circuit model, the excitation force F may be analogized as a voltage, the velocity v may be analogized as a current, the inertia m (provided by the mass component) may be analogized as an inductance, the compliance c (c=1/k, k denotes the elastic coefficient provided by the elastic component) may be analogized as a capacitor, and the damping r (provided by the damping component) may be analogized as a resistor, thus the analog circuit model of the mechanical impedance of the impedance apparatus is obtained. As shown in FIG. 11, the analog circuit model is a series circuit of an inductor, a capacitor, and a resistor. Thus, the mechanical impedance Z is expressed as:

$$Z = j\omega m + \frac{k}{j\omega} + r = R_m + jX_m, \tag{2}$$

where m denotes the inertia, k denotes the elastic coefficient, r denotes the damping, and ω denotes the angular velocity of the vibration of the vibration unit. The mechanical impedance is a complex number and may be written in a form of a real part with an imaginary part. Further, the frequency response of the mechanical impedance magnitude may be expressed as:

$$dB = 20 \times \log_{10}(|Z|), \tag{3}$$

where a reference value 0 dB represents 1V s/m.

In combination with the above formulas (1), (2), and (3), it may be known that the impedance apparatus may be adjusted by adjusting the mass of the impedance apparatus, the elastic coefficient of the elastic component, or the damping of the damping component. Thus, the mechanical impedance provided by the impedance apparatus is approximately consistent with the mechanical impedance of the vicinity of the tragus region of the head. The frequency response curve of the mechanical impedance of the vicinity of the tragus region of the head has a valley in a specific frequency range (for example, 50 Hz-500 Hz), that is, the mechanical impedance of the vicinity of the tragus region of the head has a minimum value (also known as the valley value) in the specific frequency range. In addition, when the frequency is less than the specific frequency range, the mechanical impedance of the vicinity of the tragus region of the head decreases as the frequency increases, and when the frequency is greater than the specific frequency range, the mechanical impedance of the vicinity of the tragus region of the head increases as the frequency increases. In some embodiments, the specific frequency may not be limited to the above-mentioned range of 50 Hz-500 Hz. In some embodiments, the specific frequency may also be other frequencies such as in the range of 60 Hz-400 Hz, in the range of 70 Hz-300 Hz, or in the range of 80 Hz-200 Hz, or any frequency value in the range.

In some embodiments, the damping of the impedance apparatus may be adjusted so that the valley value of the mechanical impedance provided by the impedance apparatus is consistent or approximately consistent with the valley value of mechanical impedance of the vicinity of the tragus region of the head. In some embodiments, the damping of the damping component may be adjusted to be in the range of 1-4, so that the value of the alley of the mechanical impedance of the impedance apparatus is in the range of 0 dB-15 dB. Preferably, the damping of the damping component may be adjusted to be in the range of 1.5-3.9, so that the valley value of the mechanical impedance of the impedance apparatus is in the range of 2 dB-13 dB. Further preferably, the damping of the damping component may be adjusted to be in the range of 2-3.7, so that the valley value of the mechanical impedance of the impedance apparatus is in the range of 3 dB-12 dB. More preferably, the damping of the damping component may be adjusted to in the range of 2.4-3.2, so that the valley value of the mechanical impedance of the impedance apparatus is in the range of 6 dB-10 dB.

In some embodiments, the mass of the mass component and the elastic coefficient of the elastic component may be adjusted so that the frequency corresponding to the valley value may be within a specific frequency range. In some embodiments, the mass of the mass component may be adjusted to be in the range of 0.5 g-5 g, and the elastic coefficient of the elastic component may be adjusted to be in the range of 600 N/m-5000 N/m, so that the valley value of the impedance apparatus may be in the range of 50 Hz-500 Hz. Preferably, the mass of the mass component may be adjusted to be in the range of 0.8 g-4.5 g, and the elastic coefficient of the elastic component may be adjusted to be in the range of 700 N/m-3500 N/m, so that the valley value of the impedance apparatus may be in the range of 60 Hz-320 Hz. More preferably, the mass of the mass component may be adjusted to be in the range of 1 g-3.6 g, and the elastic coefficient of the elastic component may be adjusted to be in the range of 900 N/m-1700 N/m, so that the valley value of the impedance apparatus may be in the range of 80 Hz-200 Hz.

Figure 12:
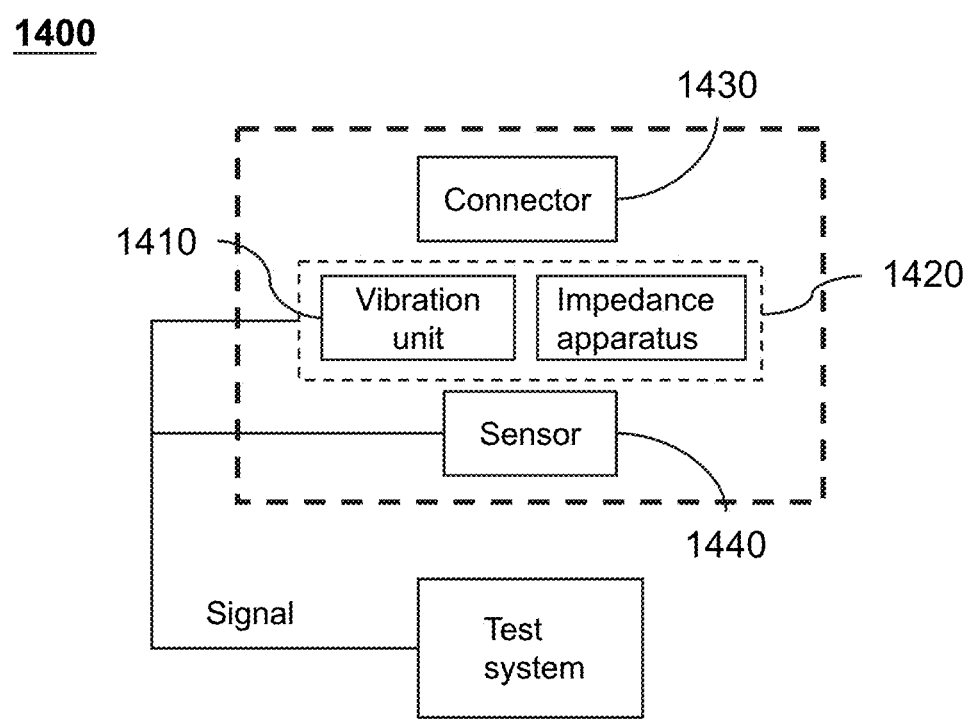
FIG. 12 illustrates an exemplary frame diagram of a system for simulating an effect of a head on vibration of a vibration unit according to some embodiments of the present disclosure.

FIG. 12 illustrates an exemplary frame diagram of a system for simulating an effect of a head on vibration of a vibration unit according to some embodiments of the present disclosure. As shown in FIG. 12, the system 1400 includes a vibration unit 1410, an impedance apparatus 1420, a connector 1430, and a sensor 1440.

In some embodiments, the vibration unit 1410 may be configured to provide a vibration signal. In some embodiments, the vibration unit 1410 may convert a signal containing audio information into a vibration signal. In some embodiments, the audio information may include a video file, an audio file with a specific data format, or a data or file that may be converted into audio through a specific approach. The signal containing the audio information may be from a storage component that communicates with or is connected with the vibration unit 1410. In some embodiments, the signal containing audio information may include an electrical signal, an optical signal, a magnetic signal, a mechanical signal, etc., or any combination thereof. In some embodiments, the vibration unit 1410 may acquire the signal containing the audio information in a variety of different ways. Signal acquisition ways include but are not limited to wired or wireless acquisition, and may also include real-time acquisition or delayed acquisition. For example, the vibration unit 1410 may receive an electrical signal containing audio information in a wired or wireless manner, or may directly acquire data from a storage medium to generate a signal. In some embodiments, the vibration unit 1410 may realize the conversion of a signal containing audio information into a mechanical vibration, and the conversion process may include the coexistence and conversion of multiple different types of energy. For example, the electrical signal may be directly converted into the mechanical vibration through a transducer device to produce sound. For example, audio information may be contained in the optical signal, and the process of converting the optical signal into the vibration signal may be realized by the transducer device. Other types of energy that can coexist and transform during the operation of the transducer device may include thermal energy, magnetic field energy, etc. In some embodiments, the energy conversion manner of the transducer device may include a moving coil type, an electrostatic type, a piezoelectric type, a moving iron type, a pneumatic type, an electromagnetic type, etc., or any combination thereof.

In some embodiments, the impedance apparatus 1420 may contact the vibration unit 1410 and provide a mechanical impedance to the vibration unit 1410. In some embodiments, there is a certain pressure between the impedance apparatus 1420 and the vibration unit 1410. The mechanical impedance provided by the impedance apparatus 1420 may simulate the impedance of the head relative to the vibration unit 1410 during actual use, and a vibration state of the vibration unit 1410 provided with the mechanical impedance is consistent with or substantially consistent with the vibration characteristic when it is actually used on the head, so as to enable the system to simulate the effect of the mechanical impedance of the head on the vibration state of the vibration unit 1410 when the vibration unit 1410 couples with the head and vibrates. For the specific content of the impedance apparatus, please refer to the relevant descriptions and descriptions in FIG. 1 to FIG. 10, which will not be repeated here.

In some embodiments, the connector 1430 may be configured to couple the vibration unit 1410 with the impedance apparatus 1420. In some embodiments, the connector 1430 may provide a pressure of 0.05 N-3.5 N between the vibration unit 1410 and the impedance apparatus 1420. Preferably, the connector 1430 may provide the vibration unit 1410 and the impedance apparatus 1420 with a pressure of 0.1N-3N. Preferably, the connector 1430 may provide the vibration unit 1410 and the impedance apparatus 1420 with a pressure of 0.3 N-2.5 N. Preferably, the connector 1430 may provide the vibration unit 1410 and the impedance apparatus 1420 with a pressure of 0.5 N-2 N. Preferably, the connector 1430 may provide the vibration unit 1410 and the impedance apparatus 1420 with a pressure of 0.8 N-1.8 N. Preferably, the connector 1430 may provide the vibration unit 1410 and the impedance apparatus 1420 with a pressure of 1 N-1.5 N. In some embodiments, the connector 1430 may be connected with the vibration unit 1410 and apply a pressure to the vibration unit 1410, so that the vibration unit 1410 may be coupled with the impedance apparatus 1420. In some embodiments, the connector 1430 may be connected with the vibration unit 1410 and fixed in contact with other fixed structures. For example, the connector 1430 may be a connector that can bind the vibration unit 1410 to the other fixed structures, and other fixed structures include but are not limited to head models or fixtures, etc. In some embodiments, the connector 1430 may be integrally formed with the vibration unit 1410 and fixed in contact with other fixed structures. For example, the connector 1430 may be an ear-hook structure integrally formed for earphones, an ear-holding structure integrally formed for hearing aids, glasses frame structure formed integrally for audio glasses, etc. In some embodiments, the material of the connector 1430 may include, but is not limited to, plastic and metal with certain hardness and shape, and silicone and fabric with certain elasticity.

In some embodiments, when the connector 1430 provides the vibration unit 1410 and the impedance apparatus 1420 with a pressure of 0.05 N-3.5 N, the impedance apparatus 1420 provides the vibration unit 1410 with a mechanical impedance in the range of 6 dB-50 dB, 6. The mechanical impedance in the range of 6 dB-50 dB simulates the actual impedance fed back to the vibration unit 1410 in the vicinity of the tragus region in actual use, so that when the vibration unit 1410 and the impedance apparatus 1420 are coupled to vibrate, the effect of mechanical impedance on the vibration of the vibration unit 1410 can simulate the effect of the actual impedance of the head on the vibration of the vibration unit 1410 when the vibration unit 1410 couples to the head to vibrate, thereby facilitating the development and production of related products for testing or calibration.

In order to ensure that the vibration unit 1410 and the impedance apparatus 1420 are fully fitted, in some embodiments, an area of a coupling region between the impedance apparatus 1420 and the vibration unit 1410 may be in the range of 0.25 cm$^2$-4 cm$^2$. In some embodiments, the area of the coupling region between the impedance apparatus 1420 and the vibration unit 1410 may be in the range of 0.5 cm$^2$ to 3.8 cm$^2$. In some embodiments, the area of the coupling region between the impedance apparatus 1420 and the vibration unit 1410 may be in the range of 1 cm$^2$-3.6 cm$^2$. In some embodiments, the area of the coupling region between the impedance apparatus 1420 and the vibration unit 1410 may be in the range of 1.5 cm$^2$ to 3.4 cm$^2$. In some embodiments, the area of the coupling region between the impedance apparatus 1420 and the vibration unit 1410 may be in the range of 2 cm$^2$ to 3.2 cm$^2$. It should be noted that the area of the coupling region between the impedance apparatus 1420 and the vibration unit 1410 is not limited to the above-mentioned range, and may also be in other ranges. For example, the area of the coupling region is greater than 4 cm$^2$ or less than 0.25 cm$^2$, and the specific area of the coupling region may be adaptively adjusted according to the size of the vibration unit 1410.

In some embodiments, the sensor 1440 may be configured to collect parameter information during a vibration process of the vibration unit 1410. In some embodiments, the sensor 1440 may be further configured to collect parameter information during a vibration process of the vibration unit 1410 when the vibration unit 1410 is coupled with the impedance apparatus 1420. In some embodiments, the parameter information during the vibration process may be used to characterize the vibration effect of the vibration unit 1410. In some embodiments, the parameter information during the vibration process may include vibration characteristic data, and the vibration characteristic data may include but not limited to at least one of a vibration displacement, a vibration velocity, a vibration acceleration, etc. In some embodiments, the parameter information during the vibration process may include air-conducted acoustic characteristic data generated by the vibration, and the air-conducted acoustic characteristic data may include, but not limited to, one or more of a sound pressure level, the frequency response, etc., of the air conduction sound. In some embodiments, the sensor 1440 may be located at the vibration unit 1410, e.g., the sensor 1440 may be mounted directly on the surface or inside of the vibration unit 1410. In some embodiments, the sensor 1440 may be indirectly connected with the vibration unit 1410, e.g., the sensor 1440 may be mounted on the surface or inside of the impedance apparatus 1420, e.g., on the mass component of the impedance apparatus 1420. In some embodiments, the sensor 1440 may also be located on the connector 1430. In some embodiments, the type and/or form of the sensor 1440 may not be limited, for example, the sensor 1440 may be a non-contact laser sensor (such as a vibrometer, a Doppler tester) that may acquire vibration acceleration (velocity or displacement). The sensor 1440 may also be a contact sensor such as an acceleration sensor, a bone conduction sensor, a piezoelectric sensor, a MEMS sensor, etc.

In some embodiments, the system may further include a test system, and the test system may be connected to at least one sensor 1440 to collect and/or process detection signals of the at least one sensor 1440. In some embodiments, the test system may be connected with the vibration unit 1410 to provide a drive signal to the vibration unit 1410, so as to drive the vibration unit 1410 to generate a mechanical vibration signal. In some embodiments, the test system connects the at least one sensor 1440 and the vibration unit 1410, drives the vibration unit 1410 to generate mechanical vibration signals, and collects and processes the signals collected by the at least one sensor 1440.

It should be understood that the system for simulating the effect of the head on the vibration of the vibration unit 1410 shown in FIG. 12 is only for illustration and description, and does not limit the scope of the present disclosure. For those skilled in the art, various modifications and changes may be made to the system for simulating the effect of the head on the vibration of the vibration unit 1410 under the guidance of the present disclosure. For example, multiple different types or forms of sensors 1440 are provided to monitor more and more complete parameter information. As another example, the connector 1430 is removed and the vibration unit 1410 and the impedance apparatus 1420 is directly coupled by a magnetic attraction or adhesion manner. These modifications and changes are still within the scope of the present disclosure.

Figure 13:
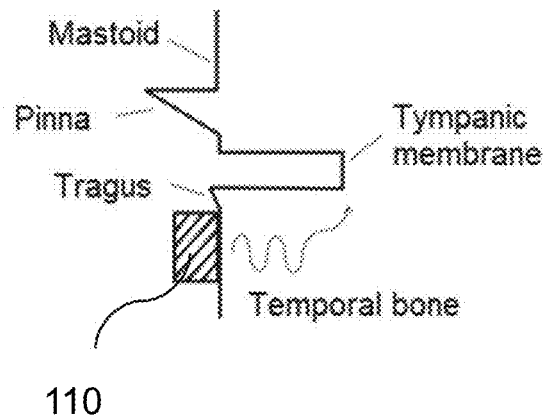
FIG. 13 illustrates a diagram of a simulated position of a coupling region between a vibration unit and the head according to some embodiments of the present disclosure.

FIG. 13 illustrates a diagram of a simulated position of a coupling region between a vibration unit and the head according to some embodiments of the present disclosure. As shown in FIG. 13, when the vibration unit 110 is coupled to the head, the vibration unit 110 is coupled to the front side of the human tragus (called the vicinity of the tragus region) along a cross section viewed from the top of the head. In some embodiments, the vibration unit 110 skips the tympanic membrane and transmits the vibration signal directly to the ossicles of the middle ear and the cochlea of the inner ear mainly by vibrating the temporal bone in front of the tragus. In some cases, the vibration of the vibration unit 110 may also drive the surrounding air to vibrate to generate a part of the air conduction sound, and the part of the air conduction sound is transmitted to the tympanic membrane through the external auditory canal. The impedance apparatuses shown in some embodiments of the present disclosure are used to simulate the actual impedance generated at the vicinity of the tragus region where the vibration unit 110 is coupled, and the system for simulating the effect of the head on the vibration of the vibration unit 110 is used to simulate the vibration effect of the actual impedance of the vicinity of the tragus region on the vibration unit 110 when the vibration unit 110 vibrates in the vicinity of the tragus region. The coupling between the vibration unit 110 and the vicinity of the tragus region may meet application scenarios of most bone conduction earphones, and may also meet application scenarios of some hearing aids. Therefore, the system for simulating the effect of the head on the vibration of the vibration unit 110 may objectively measure the vibration effect of the vibration unit 110, and simulate and characterize the actual frequency response of the vibration unit 110 when the vibration unit 110 vibrates in the vicinity of the tragus region, which may be used as a test or calibration device for research and development and production.

Figure 14:
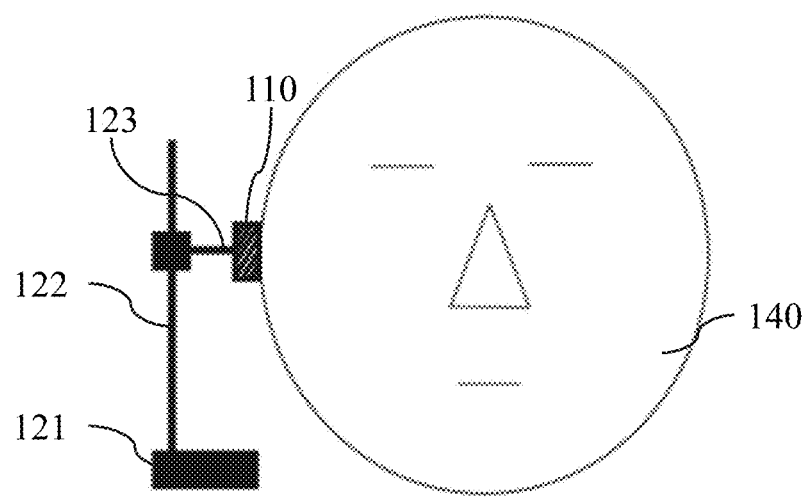
FIG. 14 illustrates a schematic structural diagram of a system for simulating an effect of a head on vibration of a vibration unit according to some embodiments of the present disclosure.

In order to facilitate the adjustment of the pressure of the coupling between the vibration unit 110 and the impedance apparatus provided by the connector, the connector may be an independent structure relative to the impedance apparatus. FIG. 14 illustrates a schematic structural diagram of a system for simulating an effect of a head on vibration of a vibration unit according to some embodiments of the present disclosure. As shown in FIG. 14, the connector may include a support rod 122 and a fixing member 123.

In some embodiments, the fixing member 123 may include a first end part and a second end part. The first end part of the fixing member 123 is connected with the support rod 122, and the second end part of the fixing member 123 is connected with the vibration unit 110. In some embodiments, the support rod 122 is used to support the fixing member 123. In some embodiments, the support rod 122 may be arranged vertically, and the fixing member 123 may be arranged horizontally. In some embodiments, a force of the fixing member 123 against the vibration unit 110 may provide a pressure between the vibration unit 110 to couple with the impedance apparatus. In some embodiments, by fine-tuning a distance between the support rod 122 and a damping apparatus, the magnitude of the pressure for coupling between the vibration unit 110 and the impedance apparatus provided by the connector may be adjusted. In some embodiments, by fine-tuning the length of the fixing member 123, the magnitude of the pressure provided for coupling between the vibration unit 110 and the impedance apparatus provided by the connector may be adjusted. In some embodiments, the first end part of the fixing member 123 may be connected to move relatively along the support rod 122, which may facilitate adjusting the height of the fixing member 123, so that the vibration unit 110 may match the height of the impedance apparatus.

In some embodiments, the connector may further include a base 121. The support rod 122 may be connected with the base 121, and the base 121 is used to stabilize the overall structure of the connector. In some embodiments, a first end part of the support rod 122 is connected with the base 121, and a second end part of the support rod 122 is connected with the first end of the fixing member 123.

In some embodiments, the system may further include a head model 140. The head model 140 is used to simulate a real head, and the connector is arranged relative to the head model 140. In some embodiments, the impedance apparatus is located at the vicinity of the tragus region of the head model 140, and the vibration unit 110 connected with the connector couples with the impedance apparatus under a pressure from the connector. In some embodiments, the impedance apparatus may be placed on the surface of the head model 140. In some embodiments, the impedance apparatus may be embedded in the head model 140.

Figure 15:
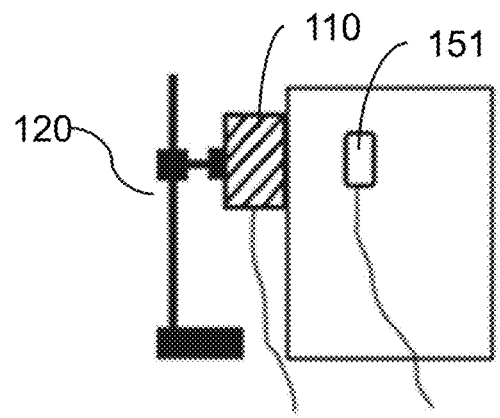
FIG. 15 illustrates a schematic diagram of the distribution of sensors according to some embodiments of the present disclosure.
Figure 15:
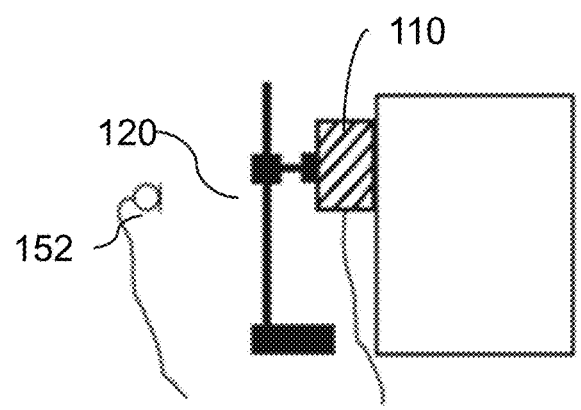
Figure 15:
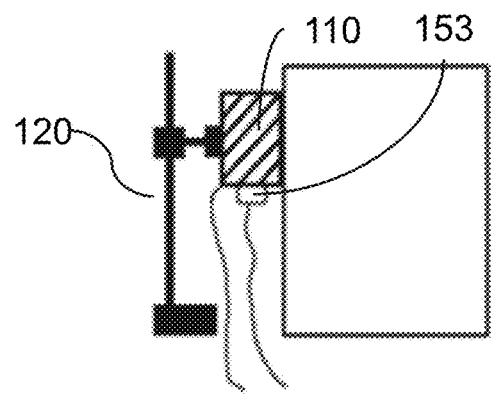

In some embodiments, the sensor may be arranged at any position of the system where the parameter information during the vibration process of the vibration unit 110 may be monitored. FIG. 15 illustrates a schematic diagram of the distribution of sensors according to some embodiments of the present disclosure.

As shown in FIG. 15(a), in some embodiments, the connector 120 may couple the vibration unit 110 with an impedance apparatus (not shown in the figure), and the sensor 151 may be placed inside or on the surface of the impedance apparatus. The sensor 151 acquires the parameter information in the vibration process of the vibration unit 110 by collecting parameter information of the impedance apparatus vibrated by the vibration of the vibration unit 110. In some embodiments, the sensor 151 is installed on the mass component of the impedance apparatus. The mass component is contacted with the vibration unit 110, the vibration unit 110 pushes the mass component to vibrate, and the mass component directly responds to the vibration frequency of the vibration unit 110. The sensor 151 may obtain the parameter information during the vibration process of the vibration unit 110 by obtaining the parameter information during the vibration process of the mass component.

As shown in FIG. 15(b), in some embodiments, the connector 120 may couple the vibration unit 110 with an impedance apparatus (not shown in the figure), and the sensor 152 may be placed independently with respect to the impedance apparatus, the vibration unit 110, and the connector 120. For example, the sensor 152 may be integrated into a main controller of the system, and the sensor 152 may acquire the parameter information during the vibration process by collecting the air conduction acoustic characteristic data generated by the vibration of the vibration unit 110. As another example, the sensor 152 may be a laser velocimeter to measure the velocity/acceleration of the surface of the vibration unit or mass component.

As shown in FIG. 15(c), in some embodiments, the connector 120 may couple the vibration unit 110 with an impedance apparatus (not shown in the figure), and the sensor 153 may be placed inside or on the surface of the vibration unit 110. The sensor 153 may directly collect the parameter information during the vibration process of the vibration unit 110. In some embodiments, the sensor 153 may be integrated inside the apparatus including the vibration unit 110, and the sensor may be used to collect the parameter information during the vibration process of the vibration unit 110 for debugging and calibration of the headset. In addition, the sensor may also be used to sense whether the headset is completely worn by monitoring the frequency response, such as whether it is completely worn on the face.

Figure 16:
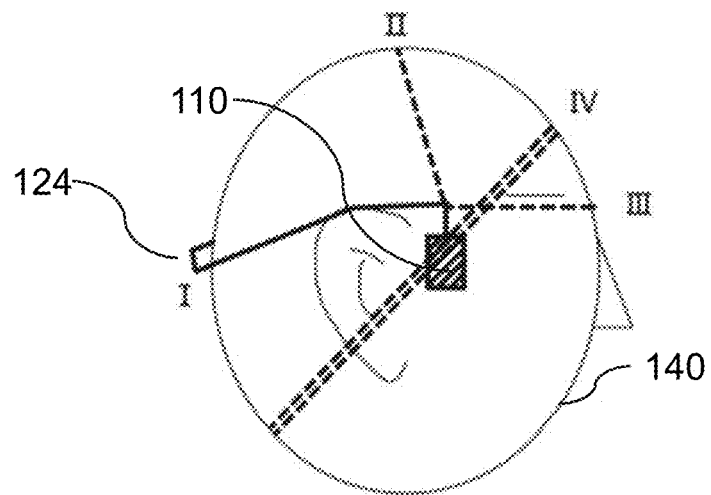
FIG. 16 illustrates a schematic structural diagram of the fitting of a connector and a head model according to some embodiments of the present disclosure.
Figure 17:
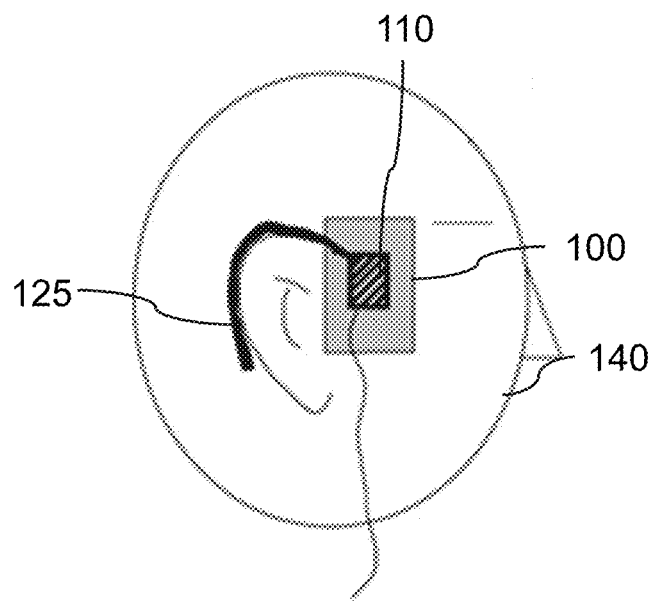
FIG. 17 illustrates a schematic structural diagram of the fitting of a connector and a head model according to other embodiments of the present disclosure.
Figure 18:
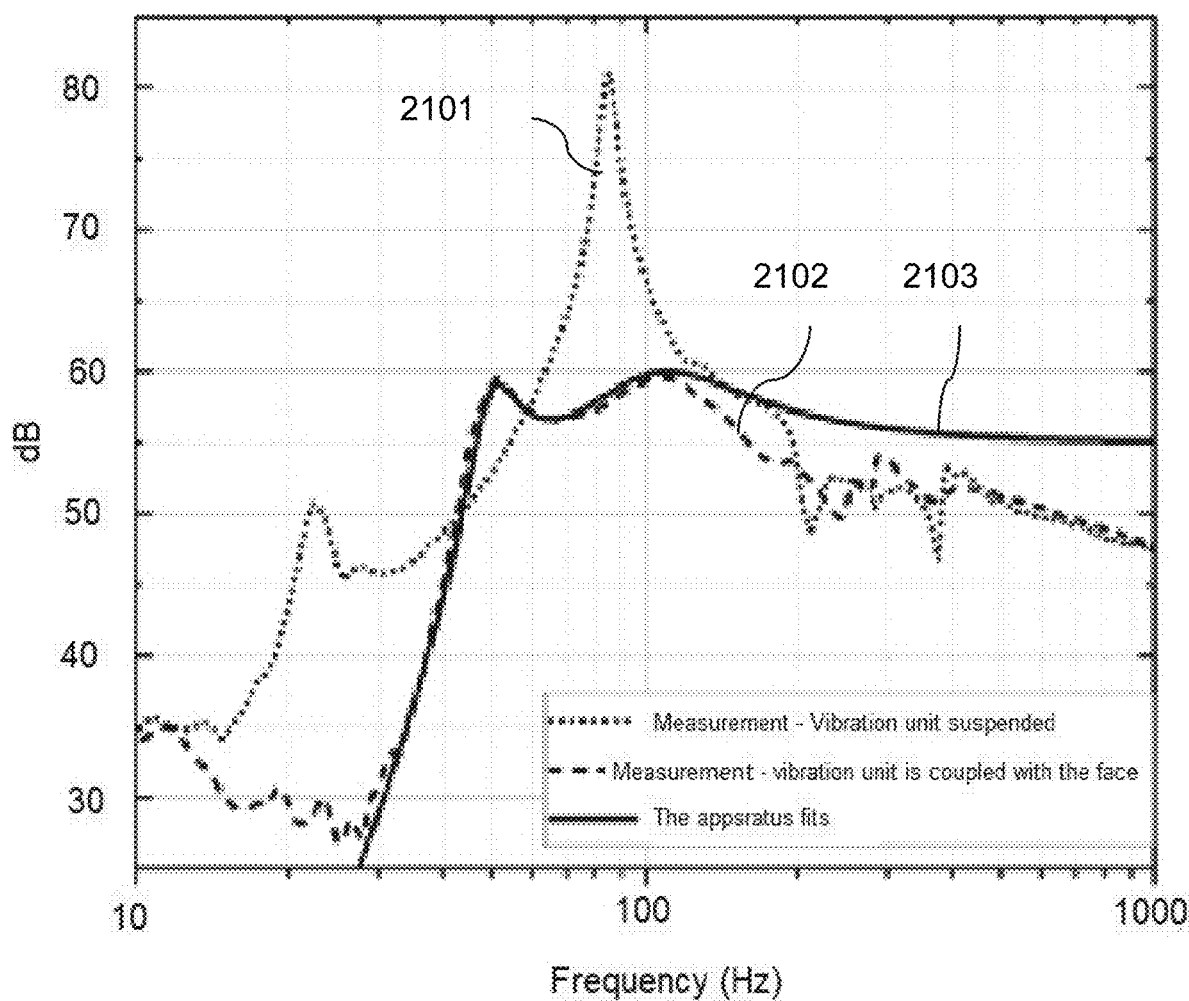
FIG. 18 illustrates a diagram of a frequency response curve of a system for simulating an effect of a head on vibration of a vibration unit.

It should be noted that the system diagrams shown in FIG. 14 and FIG. 15 are only for exemplary description, and do not limit the scope of the present disclosure. For those skilled in the art, under the guidance of the present disclosure, various modifications and changes may be made to the system for simulating the effect of the head on the vibration of the vibration unit 110. For example, no base is provided. As another example, the specific structure of the connector is changed, and these modifications and changes are still within the scope of the present disclosure. The structures and components of the vibration unit 110 and the impedance apparatus shown in FIG. 14 and FIG. 15 are the same as or similar to the structures and components of the vibration unit and the impedance apparatus described in FIG. 12, and FIG. 1-FIG. 10 and for more details, please refer to its description. In some embodiments, in order to further simulate the fitting of the apparatus and the head through the connector during actual use, the connector may be directly matched with the head. FIG. 16-FIG. 18 illustrate schematic structural diagrams of the fitting of a connector and a head model according to some embodiments of the present disclosure.

In some embodiments, as shown in FIG. 16, the connector may be a ribbon-like structure 124, and the ribbon-like structure 124 surrounds the head model 140 and secures the vibration unit 110 at the impedance apparatus. In some embodiments, the ribbon-like structure 124 may be implemented as mode I. The ribbon-like structure 124 bypasses the back of the head, and the two sides are respectively connected with the vibration units 110 located at the left ear and the right ear of the head model 140, and the structure of the vibration unit 110 is supported by the top of the head as a fulcrum to realize the coupling of the vibration unit 110 and the head model 140. In some embodiments, the ribbon-like structure 124 may be implemented as mode II. The ribbon-like structure 124 bypasses the top of the head, and the two sides are respectively connected with the vibration units 110 located at the left ear and the right ear of the head model 140, and the overall structure of the vibration unit 110 is supported by the top of the head as a fulcrum to realize the coupling of the vibration unit 110 and the head model 140. In some embodiments, the ribbon-like structure 124 may be implemented as mode III. The ribbon-like structure 124 bypasses the face, and the two sides are respectively connected with the vibration units 110 located at the left ear and the right ear of the head model 140, for example, in the form of glasses, and the overall structure of the vibration unit 110 is supported by the bridge of the nose as a fulcrum to realize the coupling of the vibration unit 110 and the head model 140. In some embodiments, the ribbon-like structure 124 may be implemented as mode IV. The ribbon-like structure 124 bypasses the forehead and the back of the head, that is, the ribbon-like structure 124 bypasses the head at least once, and the two sides are respectively connected or crimped with the vibration units 110 located at the left ear and the right ear of the head model 140. In some embodiments, a hole may be drilled on the head model 140 near the impedance apparatus. The ribbon-like structure 124 is inserted through the hole and is fixed, and the ribbon-like structure 124 presses the vibration unit 110 to the impedance apparatus. In some embodiments, the ribbon-like structure 124 may be an elastic structure such as an elastic belt, a rubber band, etc. The ribbon-like structure 124 may also be an inelastic structure with adjustable length.

In some embodiments, as shown in FIG. 17, the connector may be an ear-hook structure 125, and the ear-hook structure 125 secures the vibration unit 110 at the impedance apparatus 100. In some embodiments, the ear-hook structure 125 is adapted to the auricle of the head model 140. In some embodiments, the ear-hook structure 125 is adapted to the ear concha of the head model 140. In some embodiments, the ear-hook structure 125 may be a unilateral ear-hook structure 125, and the ear-hook structure 125 may be disposed on either side of the ear, so as to fix a vibration unit 110 at the impedance apparatus 100 corresponding to the ear. In some embodiments, the ear-hook structure 125 may be a bilateral ear-hook structure 125, and the two vibration units 110 may be respectively secured at the impedance apparatus 100 of the ears on both sides.

It should be noted that the structure of the connector shown in FIG. 16-FIG. 17 are only for exemplary description, and do not limit the scope of the present disclosure. For those skilled in the art, the structure of the connector may be modified or changed under the guidance of the present disclosure. For example, a count of the ribbon-like structures may be multiple, and the ribbon-like structure may wrap the entire head. As another example, the ear-hook structure may be wrapped in a form of an earmuff on the entire ear. These modifications and changes are still within the scope of the present disclosure.

FIG. 18 illustrates a frequency response curve diagram of a system for simulating an effect of a head on vibration of a vibration unit. The short dot curve represents the measured frequency response curve 2101 of the vibration unit when the vibration unit is suspended, the short dashed curve represents the measured vibration frequency curve 2102 after the coupling between the vibration unit and the vicinity of the tragus region of actual person's face, and the solid line curve represents the frequency response curve 2103 after the coupling between the impedance apparatus and the vibration unit. As shown in FIG. 18, by comparing the frequency response curve 2101 and the frequency response curve 2102, it can be seen that a difference between the frequency response curve of the vibration unit when the vibration unit is suspended and the vibration frequency curve after the coupling between the vibration unit and the vicinity of the tragus region of actual person's face is indeed significant. By comparing the frequency response curve 2102 and the frequency response curve 2103, in the range of 25 Hz-100 Hz, the frequency response after the coupling between the impedance apparatus and the vibration unit is basically consistent with the frequency response after the coupling between the vibration unit and the vicinity of the tragus region of actual person's face; in the range of 100 Hz-1000 Hz, a difference between the frequency response after the coupling between the impedance apparatus and the vibration unit and the frequency response after the coupling between the vibration unit and the vicinity of the tragus region of actual person's face is small, that is, the frequency response curve 2102 and the frequency response curve 2103 are basically the same. It can be seen that the impedance apparatus described in this description is basically consistent with the mechanical impedance of the actual face, which can reflect the mechanical characteristics of the actual face.

It should be noted that the beneficial effects produced by different embodiments may be different. In different embodiments, the beneficial effects that may be produced may be any of the above or more combinations, or it may be any other beneficial effect that may be obtained.

Having thus described the basic concepts, it may be rather apparent to those skilled in the art after reading this detailed disclosure that the foregoing detailed disclosure is intended to be presented by way of example only and is not limiting. Various alterations, improvements, and modifications may occur and are intended to those skilled in the art, though not expressly stated herein. These alterations, improvements, and modifications are intended to be suggested by this disclosure and are within the spirit and scope of the exemplary embodiments of this disclosure.

Moreover, certain terminology has been used to describe embodiments of the present disclosure. For example, the terms "one embodiment," "an embodiment," and/or "some embodiments" mean that a particular feature, structure or characteristic described in connection with the embodiment is included in at least one embodiment of the present disclosure. Therefore, it is emphasized and should be appreciated that two or more references to "an embodiment," "one embodiment," or "an alternative embodiment" in various parts of this specification are not necessarily all referring to the same embodiment. Furthermore, the particular features, structures or characteristics may be combined as suitable in one or more embodiments of the present disclosure.

Furthermore, the recited order of processing elements or sequences, or the use of numbers, letters, or other designations, therefore, is not intended to limit the claimed processes and methods to any order except as may be specified in the claims. Although the above disclosure discusses through various examples what is currently considered to be a variety of useful embodiments of the disclosure, it is to be understood that such detail is solely for that purpose, and that the appended claims are not limited to the disclosed embodiments, but, on the contrary, are intended to cover modifications and equivalent arrangements that are within the spirit and scope of the disclosed embodiments. For example, although the implementation of various components described above may be embodied in a hardware device, it may also be implemented as a software-only solution—e.g., an installation on an existing server or mobile device.

Similarly, it should be appreciated that in the foregoing description of embodiments of the present disclosure, various features are sometimes grouped together in a single embodiment, figure, or description thereof for the purpose of streamlining the disclosure aiding in the understanding of one or more of the various embodiments. This method of disclosure, however, is not to be interpreted as reflecting an intention that the claimed subject matter requires more features than are expressly recited in each claim. Rather, claimed subject matter may lie in less than all features of a single foregoing disclosed embodiment.

In some embodiments, the numbers expressing quantities or properties used to describe and claim certain embodiments of the application are to be understood as being modified in some instances by the term "about," "approximate," or "substantially." For example, "about," "approximate," or "substantially" may indicate ±20% variation of the value it describes, unless otherwise stated. Accordingly, in some embodiments, the numerical parameters set forth in the written description and attached claims are approximations that may vary depending upon the desired properties sought to be obtained by a particular embodiment. In some embodiments, the numerical parameters should be construed in light of the number of reported significant digits and by applying ordinary rounding techniques. Notwithstanding that the numerical ranges and parameters setting forth the broad scope of some embodiments of the application are approximations, the numerical values set forth in the specific examples are reported as precisely as practicable.

Each of the patents, patent applications, publications of patent applications, and other material, such as articles, books, specifications, publications, documents, things, and/or the like, referenced herein is hereby incorporated herein by this reference in its entirety for all purposes, excepting any prosecution file history associated with same, any of same that is inconsistent with or in conflict with the present document, or any of same that may have a limiting affect as to the broadest scope of the claims now or later associated with the present document. By way of example, should there be any inconsistency or conflict between the descriptions, definition, and/or the use of a term associated with any of the incorporated material and that associated with the present document, the description, definition, and/or the use of the term in the present document shall prevail.

In closing, it is to be understood that the embodiments of the application disclosed herein are illustrative of the principles of the embodiments of the application. Other modifications that may be employed may be within the scope of the application. Thus, by way of example, but not of limitation, alternative configurations of the embodiments of the application may be utilized in accordance with the teachings herein. Accordingly, embodiments of the present application are not limited to that precisely as shown and described.

What is claimed is:

1. An impedance apparatus, comprising:
a mass component, at least one elastic component, and a fixed component, the mass component connecting with the fixed component through the at least one elastic component;
a damping component disposed between the mass component and the fixed component and providing damping for a movement of the mass component relative to the fixed component, wherein,
when the mass component is in contact with an external vibration unit, the mass component receives a vibration of the external vibration unit and moves relative to the fixed component, a mass of the mass component is in a range of 0.5 g-5 g, an elastic coefficient of the at least one elastic component is in a range of 600 N/m-5000 N/m, a damping of the damping component is in a range of 1-4, and the impedance apparatus provides the external vibration unit with a mechanical impedance in a range of 6 dB-50 dB.

2. The impedance apparatus of claim 1, wherein a mass of the mass component is in a range of 1 g-3.6 g, an elastic coefficient of the at least one elastic component is in a range of 900 N/m-1700 N/m, and a damping of the damping component is in a range of 2-3.7.

3. The impedance apparatus of claim 1, wherein a frequency response curve of the impedance apparatus has a valley, a valley value is in a range of 6 dB to 15 dB.

4. The impedance apparatus of claim 3, wherein when a frequency is less than a frequency corresponding to the valley value, a mechanical impedance of the impedance apparatus decreases as the frequency increases; when the frequency is greater than the frequency corresponding to the valley value, the mechanical impedance of the impedance apparatus increases as the frequency increases.

5. The impedance apparatus of claim 1, wherein the fixed component includes a fixed arm, the mass component is disposed opposite to the fixed arm, one side of the mass component faces the fixed arm, and the other side of the mass component faces away from the fixed arm.

6. The impedance apparatus of claim 5, wherein the damping component is located between the mass component and the fixed arm.

7. The impedance apparatus of claim 1, wherein the at least one elastic component includes a spring, and the damping component is filled in or around the spring.

8. The impedance apparatus of claim 1, wherein the fixed component is a casing structure with one end open, and the mass component is suspended at an opening of the casing structure through the at least one elastic component.

9. The impedance apparatus of claim 8, wherein the at least one elastic component includes a first end part and a second end part, the first end part of the at least one elastic component is connected with a side wall of the mass component, and the second end part of the at least one elastic component is connected with an inner wall of the casing structure.

10. The impedance apparatus of claim 9, wherein the at least one elastic component includes multiple elastic components, and the multiple elastic components are distributed along the side wall of the mass component at intervals.

11. The impedance apparatus of claim 8, wherein the at least one elastic component further includes a mesh structure.

12. The impedance apparatus of claim 8, wherein the damping component is located between the mass component and a bottom wall of the casing structure, wherein one end of the damping component is connected with a side of the mass component, and the other end of the damping component is connected with the bottom wall of the casing structure.

13. The impedance apparatus of claim 8, wherein a sealed cavity is formed between the mass component and the casing structure, and a gas in the sealed cavity forms the at least one elastic component.

14. A system for simulating an effect of a head on vibration of a vibration unit, comprising:
a vibration unit configured to provide a vibration signal;
an impedance apparatus, the impedance apparatus contacting the vibration unit and providing a mechanical impedance to the vibration unit;
a connector configured to couple the vibration unit with the impedance apparatus; and
a sensor configured to collect parameter information of the vibration unit during a vibration process.

15. The system of claim 14, wherein the connector provides a pressure of 0.05 N-3.5 N between the vibration unit and the impedance apparatus.

16. The system of claim 14, wherein an area of a coupling region of the impedance apparatus and the vibration unit is in a range of 0.25 cm$^2$-4 cm$^2$.

17. The system of claim 14, wherein the connector includes a base, a support rod, and a fixing member, the support rod is connected with the base, the fixing member includes a first end part and a second end part, the first end part of the fixing member is connected with the support rod, and the second end part of the fixing member is connected with the vibration unit.

18. The system of claim 14, wherein the system further includes a head model, and the impedance apparatus is located in a vicinity of a tragus region of the head model.

19. The system of claim 18, wherein the connector is a ribbon-like structure, and the ribbon-like structure surrounds the head model and secures the vibration unit at the impedance apparatus.

20. The system of claim 18, wherein the connector is an ear-hook structure, the ear-hook structure is adapted to an auricle of the head model, and the ear-hook structure secures the vibration unit at the impedance apparatus.

\* \* \* \* \*